United States Patent
Parizi et al.

(10) Patent No.: US 6,385,053 B1
(45) Date of Patent: May 7, 2002

(54) PCB VERTICAL AND HORIZONTAL GUIDE

(75) Inventors: Bobby Parizi; Nguyen Nguyen; Michael Chern, all of San Jose; Saeed H. Seyedarab, Los Altos, all of CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/258,446

(22) Filed: Feb. 26, 1999

(51) Int. Cl.⁷ .............................................. H01R 12/16
(52) U.S. Cl. .................. 361/786; 361/724; 361/726; 361/741; 361/747; 361/752; 361/756; 361/802; 361/803
(58) Field of Search ................................ 361/788, 786, 361/802, 756, 741, 727, 686, 724, 726, 747, 752, 803; 439/631–633, 157, 65, 64, 374, 377, 378–379, 638–640, 201, 79; 317/101 DH; 339/17 L (56) References Cited

U.S. PATENT DOCUMENTS

| | | | |
|---|---|---|---|
| 372,708 A | 8/1887 | Hetherington | D14/114 |
| 382,857 A | 8/1888 | Chen et al. | D13/147 |
| 386,473 A | 11/1888 | England et al. | D13/147 |
| 411,827 A | 7/1889 | Gilliland et al. | D13/147 |
| 3,533,045 A * | 10/1970 | Henschen | 339/17 |
| 3,652,899 A * | 3/1972 | Henschen | 317/101 DH |
| 3,704,394 A * | 11/1972 | Johnson | 317/101 DH |
| 3,905,665 A * | 9/1975 | Lynch et al. | 339/17 L |
| 4,832,619 A * | 5/1989 | Eck et al. | 439/377 |
| 4,869,680 A | 9/1989 | Yamamoto et al. | 439/327 |
| 5,016,142 A | 5/1991 | White | 361/415 |
| 5,123,859 A | 6/1992 | Davis et al. | 439/405 |
| 5,181,858 A | 1/1993 | Matz et al. | 439/188 |
| 5,222,168 A | 6/1993 | Saito et al. | 385/59 |
| 5,291,368 A | 3/1994 | Conroy-Wass | 361/796 |
| 5,491,418 A | 2/1996 | Alfaro et al. | 324/402 |
| 5,660,567 A | 8/1997 | Nierlich et al. | 439/620 |
| 5,716,221 A | 2/1998 | Kantner | 439/64 |
| 5,757,618 A * | 5/1998 | Lee | 361/686 |
| 5,757,998 A | 5/1998 | Thatcher et al. | 385/75 |
| 5,767,999 A | 6/1998 | Kayner | 359/163 |
| 5,801,928 A | 9/1998 | Burstedt et al. | 361/801 |
| 5,809,328 A | 9/1998 | Nogales et al. | 395/825 |
| 5,836,785 A | 11/1998 | Lee | 439/505 |
| 5,879,173 A | 3/1999 | Poplawski et al. | 438/138 |
| 5,882,211 A * | 3/1999 | Choy et al. | 439/74 |
| 5,901,263 A | 5/1999 | Gaio et al. | 385/92 |
| 5,993,224 A | 11/1999 | Quillet et al. | 439/79 |
| 6,047,172 A | 4/2000 | Babineau et al. | 455/300 |
| 6,074,228 A | 6/2000 | Berg et al. | 439/180 |
| 6,108,198 A | 8/2000 | Lin | 361/683 |
| 6,115,263 A | 9/2000 | Babineau et al. | 361/796 |
| D436,919 S | 1/2001 | Wakefield et al. | D13/110 |

* cited by examiner

Primary Examiner—Jeffrey Gaffin
Assistant Examiner—Thanh Y. Tran
(74) Attorney, Agent, or Firm—Beyer Weaver & Thomas, LLP; Dean E. Wolf, Esq.

(57) ABSTRACT

A guide device receives and engages a cutout in a distal pin-bearing edge of a printed circuit board for aligning pins with pin sockets. The alignment device includes a web, sized and shaped to be received in a circuit board cutout and a shelf surface for engaging a part of a major surface of the circuit board, to provide for biaxial guidance during board insertion. By positioning guide devices and circuit board cutouts in different locations, for different circuit boards, insertion of circuit boards in an incorrect slot or location is avoided.

19 Claims, 5 Drawing Sheets

PCB VERTICAL AND HORIZONTAL GUIDE

FIELD OF THE INVENTION

The present invention relates to a guide which can assist in inserting a circuit board into a Chassis and in particular to a guide which provides bidirectional guidance.

BACKGROUND OF THE INVENTION

Many electronic devices include one or more circuit boards such as printed circuit boards (PCB'S) which are positioned in or with respect to a chassis or box. Examples from among the numerous types of electronic devices which have circuit boards provided in a chassis or a box, include computers such as personal computers, work stations, laptop computers, personal digital assistants, communication devices such as network routers, switches, bridges and the like, telephones, telefax machines, entertainment devices such as audio or video equipment and the like.

Typically the positioning of boards in a chassis is performed in a manner to couple electrical connectors or components of PCB to electrical signal sockets, traces or other connectors or components for providing signal communication to and from the board. One example is a board which include one or more pins extending therefrom, intended to be received in a pin block or receptacle having a plurality of sockets or regions for receiving the pins. Other examples of connections for printed circuit boards include edge connections (printed conductive lines or traces positioned on over or near the edge of the PCB) and like.

Insertion of boards into a chassis or a box may be performed in a number of situations including during initial fabrication of an electrical device, during testing, repair or replacement of the electrical device or components thereof, during ordinary maintenance, upgrading or modification of an electrical device (which may, in many cases, be performed by a substantially untrained end user).

Typically, for proper functioning the electronic device, the board or boards must be properly aligned with the corresponding blocks so that the pins or other electrical connectors mate with the correct sockets.

Many older circuit boards included a relatively a small number of pins or connectors such as fewer than about 800 pins per board, often fewer than about 500 pins per board. The total number of pins, as well as the size of the board and the design of the board (which can determine where, on the board, the pins may be positioned) place constraints on the density of the pins and thus on the size or diameter of the pins. Older boards, with relatively fewer pins, could be configured with pins having a relatively large diameter, i.e. which were sufficiently sturdy that the force imparted to the pins as a result of misalignment of the board with respect to the pin block, as the board is being inserted, could be tolerated by the pins and, indeed, in such a situation, the pins themselves can function to guide the board into the desired orientation with respect to the pin block or similar connector.

As designs of electronic devices have evolved, circuit boards have been developed having a relatively larger number of pins, such as over 1,000, and in some cases over 1,400 pins, in such a fashion that the spatial density of the pins in at least some parts of the board, require pins of relatively smaller diameter, in particular, of diameters such that the pins are relatively delicate and may be unable to withstand the forces resulting from a somewhat misaligned board insertion process without bending, breaking or other undesirable deformation or damage to one or more pins.

Accordingly, it would be useful to provide a procedure and apparatus which can reduce misalignment between a board and a pin block, or otherwise reduce misalignment between pins and pin sockets (or other electrical connectors) so as to reduce or avoid pin damage.

Some previous systems have provided structural (non-signal carrying) pins and sockets coupled respectively to circuit boards and chassis for assisting in alignment. However, many such devices are believed to provide relatively loose alignments which, while possibly suitable for larger-diameter pins, may be ineffective in reducing or preventing damage to relatively small-diameter pins. Additionally, it is believed that at least some previous alignment or guidance devices provided guidance along or with respect to one axis or plane, without achieving substantial guidance (and especially, without achieving close-tolerance guidance) with respect to a second non-parallel (typically orthogonal) axis or plane. Accordingly, it would be useful to provide a guidance device and procedure which can provide guidance in two non-parallel (preferably orthogonal) axes or planes, and preferably with a relatively tight spacial tolerance (high accuracy) such as a tolerance, in at least one direction of about 0.02 inches (about 0.5 mm), or less, preferably about 0.015 inches (about 0.3 mm), or less.

In some configurations, linear tracks or shelves were used for providing a degree of guidance, e.g. to board side-edges, i.e. edges parallel to the direction of board insertion. While such tracks or shelves can be useful in assisting board insertion, such tracks or shelves typically provide relatively loose guidance and typically provide guidance only in a single plane or axis (i.e. provides unidirectional guidance) and/or are spaced a relatively large distance from other, possibly pin-bearing, edges (such as an edge perpendicular to the side-edges), thus providing little guidance or support to edges of the card which may be pin-bearing edges. Such side-edge guidance or support may be insufficient to overcome gravitational or other sag-inducing forces, at least because the shelves or tracks are spaced from the central (possibly pin-bearing) region of the board where gravity-induced sag may be greatest. Such gravitational sag can be particularly troublesome for relatively larger boards (such that the side-edge supports or guides are relatively distantly positioned with respect to the middle of the board) and/or having relatively small diameter pins (such that even relatively small amounts of sag can have pin-damaging results. Sag-induced or other misalignment can be particularly difficult to correct or overcome when card insertion is performed by grasping and manipulating a card edge which is the edge that is opposite the pin-bearing edge (as is commonly the case) and in which there may be little or no close-tolerance guidance provided for the pin-bearing edge itself, such that even small movements or angular displacements at the grasping edge may result in relatively large movements or displacements at the distant pin-bearing edge. Accordingly, it would be useful to provide a board guidance procedure and method which can provide guidance in a region of the board spaced from the board side edges, such as at or near central regions of the pin-bearing edges. It would be useful to provide a device which can provide sufficient guidance to avoid or reduce pin damage in spite of gravitational sag.

Many electronic devices are configured to contain two or more different circuit boards and require, for proper functioning, that a circuit board be positioned only in a single (or a few) predetermined slot or other location, i.e. are intolerant of interchanging the positions of two or more boards. However, many chassis and/or board guidance devices are configured to receive any of a number of different boards in each location, relying on the knowledge, dexterity and accuracy of the person installing the boards. Accordingly, it would be useful to provide an apparatus and procedure which can prevent at least some or all instances of board mis-location (i.e. positioning a board in the wrong slot or other location). Preferably, in order to reduce the number of components in the electronic device, it would be advantageous to provide such board-positioning assurance as a function or component of the board guidance devices or systems.

For a guidance system to be useful for achieving alignment of pins or board components with pin blocks or other receptacles or connectors, it is, in general, useful to provide for relative alignment of the guidance components with respect to the pin blocks or other receptacles. In many situations, the cost of fabricating or manufacturing devices increases as the amount of required alignment precision increases. The amount of alignment precision, as noted above, can be particularly acute when circuit boards are provided with relatively delicate, small-radius pins. Accordingly, it would be useful to provide a board insertion guidance system which can be implemented with the desired degree of positional precision without unduly increasing the cost or complexity of the design, manufacture or assembly of the electronic device.

Another factor which can affect the cost of an electronic device is the efficiency with which components and/or circuitry can be positioned on various circuit boards. Accordingly, it would be useful to provide a guidance and/or mislocation lockout device and procedure which has a high degree of flexibility with respect to designing circuitry or components for a circuit board (e.g. which can be located in a range of positions on or with respect to the circuit board) and/or which is relatively small (i.e. which requires relatively little reduction in the amount of circuit board surface available for circuitry or components and/or connector pins).

SUMMARY OF THE INVENTION

The present invention provides a device and/or system by which a guide member interdigitates or otherwise engages with a shape, such as a cutout, recess or other shape, formed on the pin-bearing edge or connector-bearing edge of a circuit board. In one aspect, the chassis-mounted guide includes a web which is inserted into a slot or cutout formed in the pin-bearing edge of the circuit board. Beveling or chamfering of the leading edge of the web provides a lateral guiding or camming force to assist in moving or positioning the circuit board in the desired lateral direction (i.e. a direction parallel to the pin-bearing edge). The provision of relatively close tolerance between the size of the web and the size of the cutout, over a length of the web, assists in providing angular guidance, such that the pin-bearing edge is brought parallel to the pin block.

Preferably a (e.g. second) guide surface, substantially perpendicular to the plane of the web, engages a major surface (such as the bottom surface) of the circuit board to provide a transverse guidance force (i.e. in a direction substantially perpendicular to the plane of a major surface of the board). By beveling or chamfering the region adjacent the leading edge of the second guide surface, a guidance or camming force acts on the board near the pin-bearing edge in a fashion so as to guide the pins into transverse alignment with the pin block. In one embodiment, the second surface chamfer is large enough to allow the second guide surface to engage a major surface of the circuit board even when the circuit board is somewhat deformed from a strictly planar shape, such as being deformed by gravitational sag, (e.g. when the circuit board is in a horizontal or other non-vertical position during insertion).

In one embodiment, a circuit board recess or cutout is positioned in different locations (such as different positions along the pin-bearing edge of the circuit board) for different circuit boards, and a web or guidance member is positioned correspondingly on the chassis. In this way, the guidance member or web member will prevent full insertion of the wrong circuit board since, preferably, a circuit board other than the intended or proper circuit board will not have a cutout in circuit board which is positioned (or sized or shaped) to engage or receive the web or guide member.

DETAILED DESCRIPTION

Figure 1:
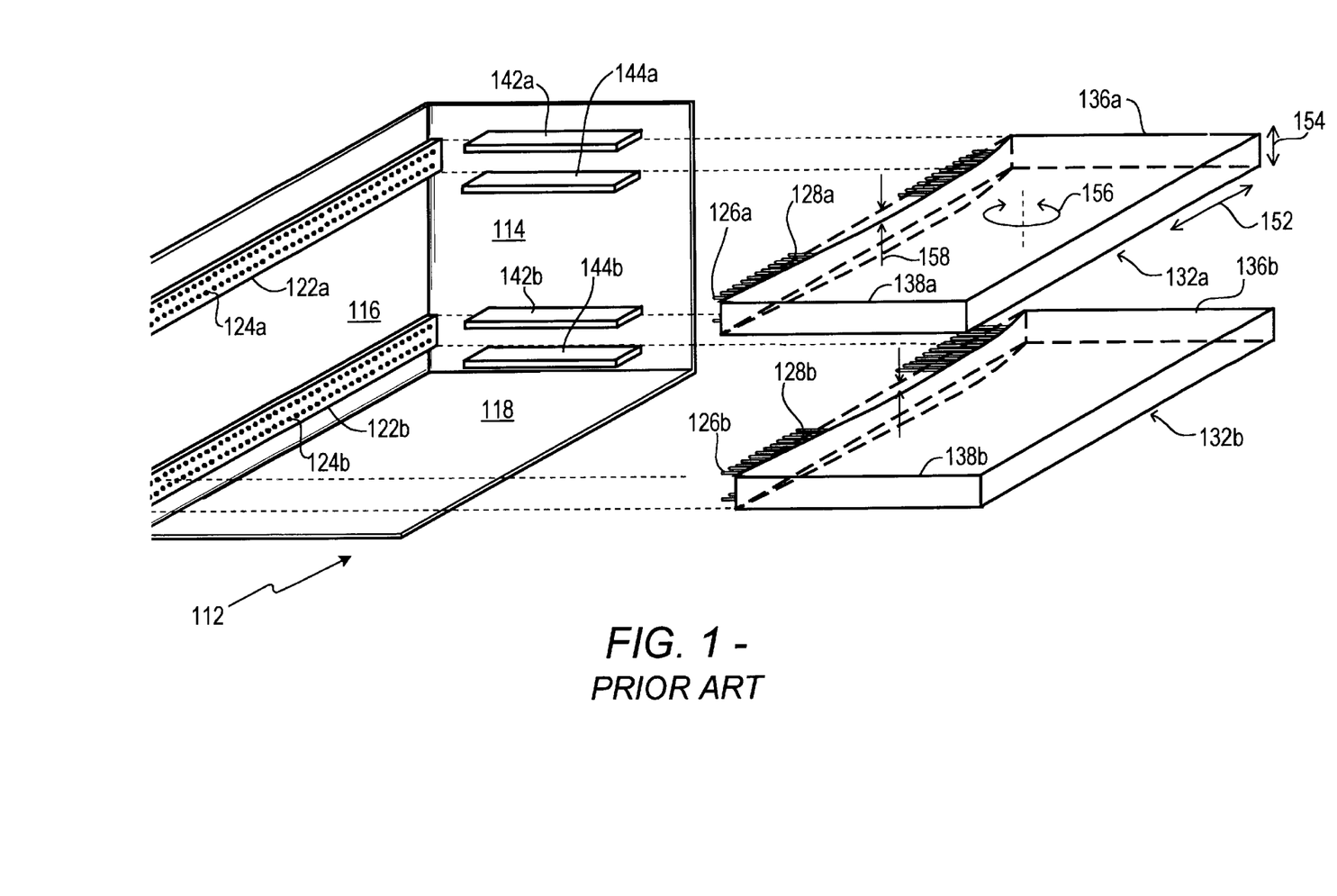
FIG. 1 is a partial, exploded view of a chassis and first and second circuit boards according to previous devices.

As depicted in FIG. 1, a chassis 112 (of which, in FIG. 1, only a side 114, rear 116 and bottom 118 wall are shown) is configured with first and second pin blocks 122a,b having a plurality of pin sockets 124a,b for receiving pins 126a,b extending outward from distal edges 128a,b of first and second circuit board 132a,b. In the configuration of FIG. 1, circuit boards 132a,b are inserted into the chassis 112 by aligning side edges 136a,b 138a,b with side edge shelf guides (of which only the right-hand shelf guides 142a,b, 144a,b are shown in the view of FIG. 1). The edges 136a,b, 138a,b are slid between the surfaces of the shelf guide 142a,b, 144a,b to bring the pins 126a,b into the vicinity of the pin blocks 122a,b. As described above, when the pins 126a,b are sufficiently large and robust, even if the pins 126a,b are not precisely aligned with the pin sockets 124a,b (e.g. owing to misalignment of the boards 136a,b in lateral 152, transverse 154, or rotational 156 directions or because of deformation such as gravitational sag 158), continued insertion force, movements or manipulation of the board to bring the pins into proper alignment impart forces on the pins 126 which the pins are sufficiently robust to withstand without substantial damage. However, when the pins 126a, 126b are relatively delicate, such as small diameter pins, e.g. of the type that may be provided on boards having 1000 pins or more, the relatively more delicate pins may be damaged or bent by forces imparted to the pins during attempts to bring the pins into alignment with the pin sockets.

Figure 2:
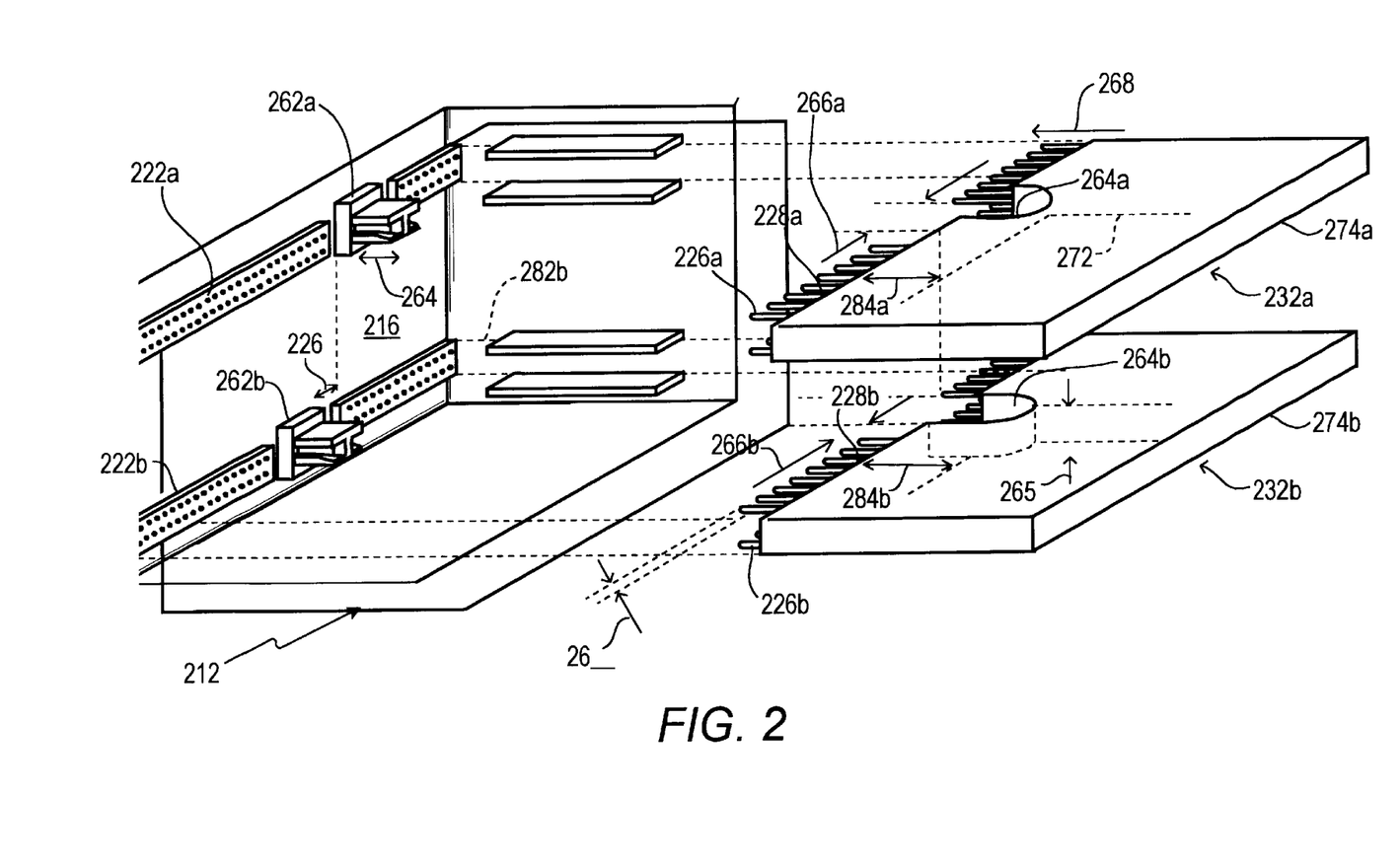
FIG. 2 is a partial, exploded diagram showing a circuit board insertion guidance and positioning system according to an embodiment of the present invention.

FIG. 2 illustrates a configuration in which guidance devices 262a, 262b interdigitate or otherwise engage contours, such as cutouts 264a, 264b, provided in the distal edges 228a,b of first and second circuit boards 232a,b. Although different sizes and shapes of recesses 264a, 264b are possible, the configuration depicted in FIG. 2 provides for cutouts 264a,b which extend the full depth 265 of the circuit boards and have a substantially un-shaped profile. Preferably the engagement surfaces (described more thoroughly below) of the guidance devices 262a,b extend a distance 264 outward from the surface of pin blocks 222a,b which is greater than the distance 266 that the pins 226a,b extend outward from the distal edges 228a,b of the circuit boards 232a,b, so that the guidance devices 262a,b can act to begin positioning the boards 232a,b for proper alignment (as described below) before the pins 226a,b contact the pin blocks 222a,b. The arrangement avoids damage to the pins by providing for alignment for the pins with the pin sockets before the time the pins reach the pin blocks.

As depicted in FIGS. 3A, 3B and 4–9, in one embodiment, the guidance device includes a web 312 having a maximum width 512 (FIG. 5) substantially equal to the width 266a,b of the circuit board cutouts 264a,b (so that the web 312 can slide into the cutout 264a,b, as described below). In the depicted configuration, the center portion of the web 312 includes a plurality of recesses 616a through 616h. The recesses 616a, 616h are provided for convenience and efficiency in injection molding of the guidance device 262a,b and can be omitted, e.g., depending on the method and materials for fabricating guidance devices 262a,b.

At least one, and preferably both, sidewalls of the web 514, 516 adjacent the leading edge 712 (FIG. 7) of the web 312, are chamfered or angled 612 to provide a leading edge width 518 of the web 312 which is less than the maximum width 512 of the web 312. The chamfer permits the leading edge 712 of the web 312 to be inserted into the circuit board cutout 264a, 264b even if the circuit boards 232a,b are somewhat laterally or rotationally misaligned. In the case of such misalignments, as the circuit boards 232a,b are inserted in an insertion direction 268, one or the other leading edges of the cutouts 264a, 264b will contact and bear against the chamfered web surfaces 514, 516 which will impart a lateral or rotational force, via the camming action of the chamfered edges 514, 516 on the leading edges of the cutouts 264a,b tending to align the circuit boards 232a laterally and/or rotationally so that the centerline of the cutout 272 is parallel and aligned with the (vertical) plane of symmetry 612 of the guidance member. By proper lateral position of the guidance devices 262a,b, the boards 232a,b can thus be brought into desired lateral alignment with the pins 226a,b aligned with the pin sockets of the pin blocks 222a,b.

Figure 3A:
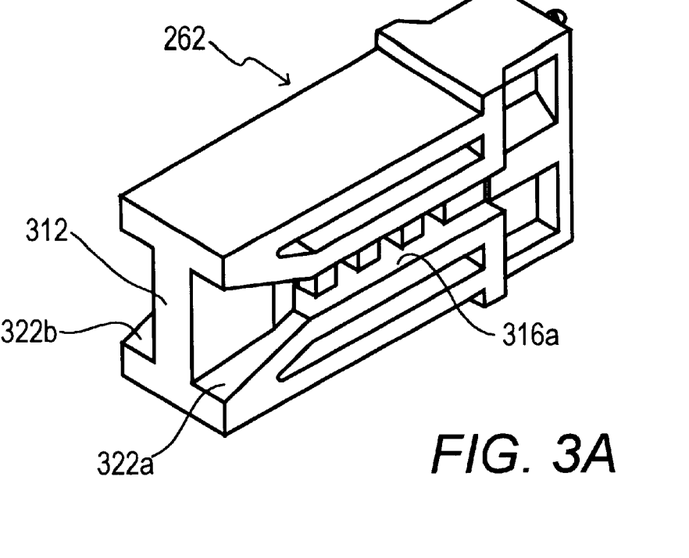
FIGS. 3A and 3B are front and rear perspective views of a guide member according to an embodiment of the present invention.
Figure 3B:
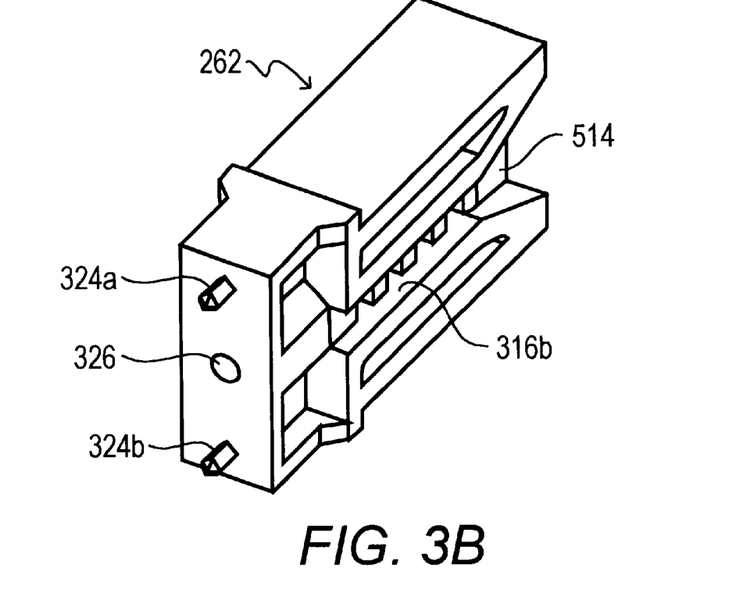
Figure 4:
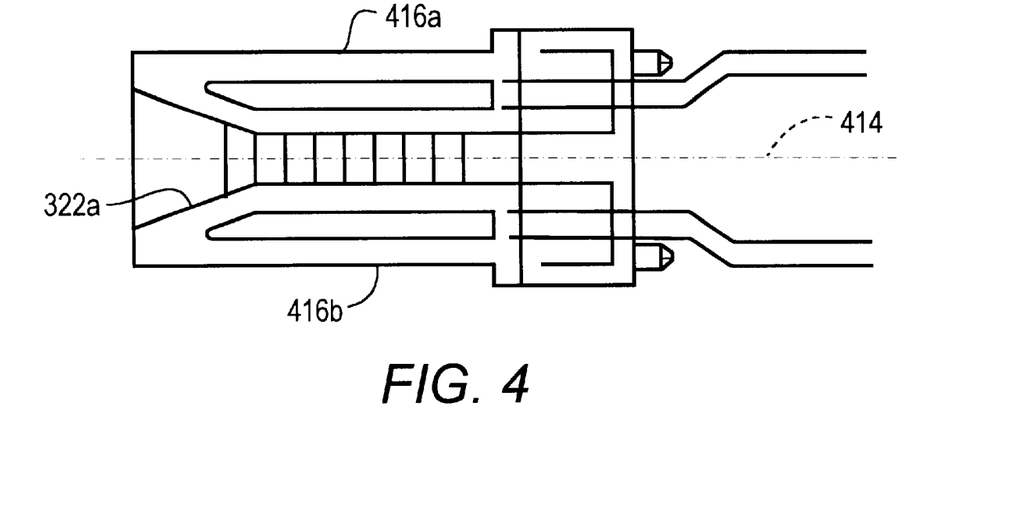
FIG. 4 is a side elevational view of the guide member of FIGS. 3A and 3B.
Figure 5:
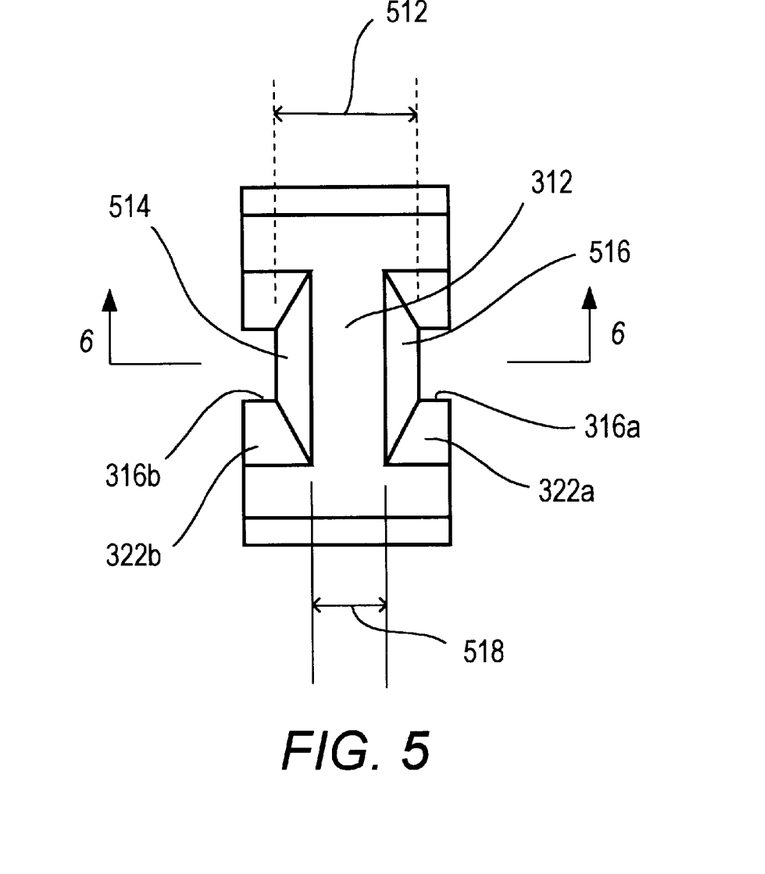
FIG. 5 is a front elevational view of the guide member of FIGS. 3A and 3B.
Figure 6:
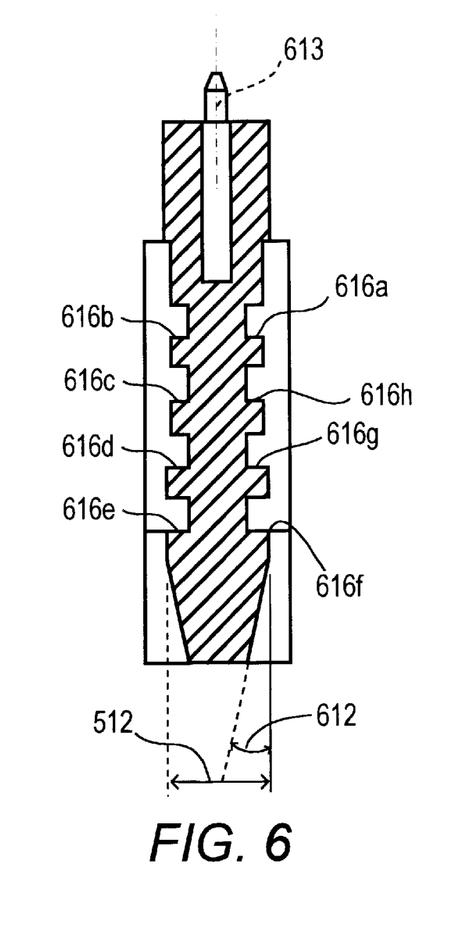
FIG. 6 is a cross-sectional view taken along the line 6—6 of FIG. 5.
Figure 7:
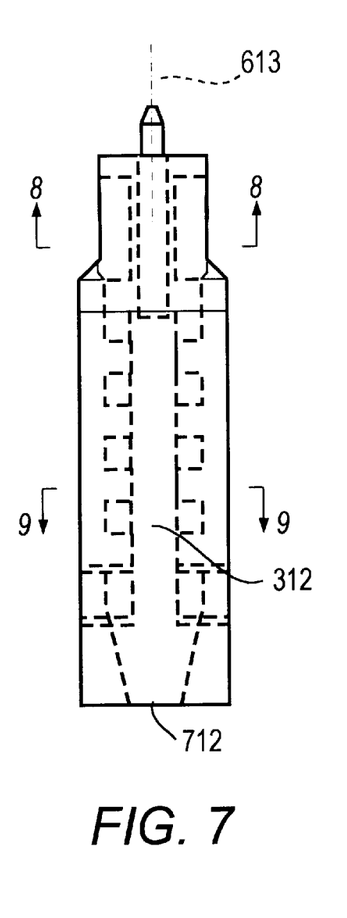
FIG. 7 is a top plan view of the guidance device of FIG. 3A and 3B.
Figure 8:
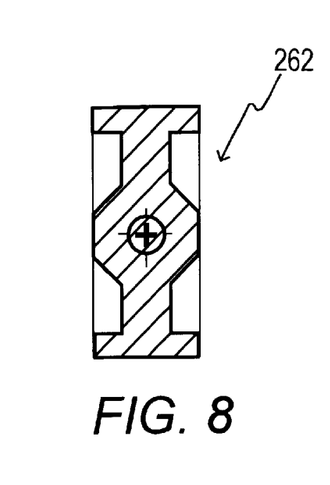
FIG. 8 is a cross-sectional view taken along line 8—8 of FIG. 7.
Figure 9:
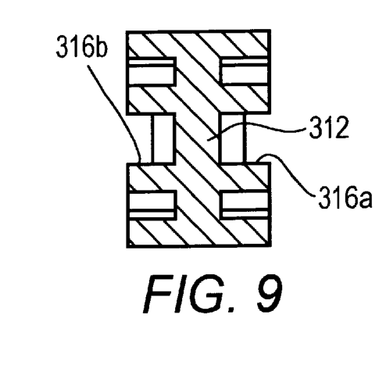
FIG. 9 is a cross-sectional view taken along line 9—9 of FIG. 7.

Guidance devices 262, as depicted, include first and second shelves 316a,b extending laterally outward from the web 312 in such a manner as to contact the under-surface 274a,b of circuit boards 232a,b, e.g. adjacent the edges of the cutouts 264a,b. By proper vertical positioning of the guidance devices 262a,b, the distal edges 228a,b of the boards 232a,b can be supported at heights such that the pins 226a,b are vertically aligned with the pin sockets of the pin blocks 222a,b.

In the depicted embodiments, regions 322a,b of the shelves 316a,b near the leading edges 712 are angled or chamfered sufficiently to accommodate a degree of transverse misalignment or gravitational sagging (or other deformation) of the circuit board distal edges 228a,b. Accordingly, as the boards 232a,b are inserted, if the lower surface 274a,b of the board in the region adjacent the cutouts 264a,b is vertically displaced or sagged downward, the leading edges of the board lower surface 274a,b in the region of the cutouts 264a,b will contact the chamfered surfaces 322 of the shelf and further insertion 268 of the board will cause (via a camming action) the lower surface 274a,b of the board to ride up on the chamfered surface 322a,b until reaching the level of the main portion of the shelves 316a,b to position the distal edge 228a,b of the board at the desired height.

Once the guide 262a,b have assisted in aligning the distal edges 228a,b of the boards 232a,b in the desired positions, with the pins 226a,b aligned with the pin sockets of the pin blocks 222a,b, continued insertion 268 of the boards will engage the pins 226a,b with the pin sockets of the pin blocks 222a,b, avoiding bending or damaging the pins.

In one embodiment, the positioning of the guides 262a,b at the desired location on the chassis 212 is facilitated by one or more locating pins 324a,b extending outward from a rear surface of the guidance device 262. Preferably, holes or recesses are punched, drilled or otherwise formed in the rear wall 216 of the chassis 212 in positions so that, when the locating pins 224a,b are received in such drilled holes, the guidance device 262 will be in the desired location. Preferably, a screw, bolt, rivet or the like, e.g. received in hole 326 can be used for retaining the guidance device 262 in the desired location. To further facilitate positioning of the guidance device 262, the guidance devices 262 are preferably configured so that they are shaped symmetrically about a vertical plane 613 and about a horizontal plane 414. In this way, it would be indistinguishable whether the guidance device is mounted with a first surface 416a or a second surface 416b uppermost.

Although it would be possible to provide guidance devices at similar or identical locations along the distal edges of different circuit boards (such as, for example, precisely midway along the distal edge), in the embodiment of FIG. 2, the guidance devices 262a, 262b for two difference boards are laterally offset a distance 276 with respect to one another and the slots in the corresponding boards are similarly offset 278. This configuration provides the benefit of preventing full insertion of a board in an incorrect location. For example, if an attempt was made to insert the upper board 232 in the lower location 282b, the web of the lower guidance device 262b would not be aligned with the slot 264a of the upper board 232a, thus preventing full insertion of the incorrect board 232a. If desired, selective lockout can also be provided by providing the cutouts with differing widths 266a,b and/or depth 284a,b either in place of or in addition to lockouts based on lateral positioning 276, 278.

In light of the above description, a number of advantages of the present invention can be seen. The present invention provides sufficient guidance assistance to provide for alignment of circuit board pins or other connectors in desired location during board insertion into a chassis that damage or bending of pins or other connectors is reduced or eliminated, even when the pins are relatively small-diameter and/or delicate, relatively dense, and/or the boards relatively large. The present invention provides guidance during board insertion, particularly of the distal (typically pin-bearing) edge in two different, preferably or orthogonal directions or axes such as lateral and transverse (or vertical and horizontal) alignment even in the face of board deformation such as gravitational sagging, and even when board insertion is performed by grasping and/or manipulating edges which are opposite to and relatively far-spaced from the pin-bearing edge. The present invention can be used in connection with avoiding or eliminating improper placement of circuit boards such as placement in an improper or wrong slot. The present invention can be implemented in a fashion which is relatively non-complex and low-cost to fabricate, install and use.

A number of variations of modifications of the invention can be used. It is possible to use some aspects of the invention without using another. For example, it is possible to use devices for guiding boards during insertion without providing for lockout of improperly-placed boards and vice versa. Although it is currently preferred to fashion guidance devices e.g. as described herein, out of a plastic material, e.g. using injection molding or similar processes, it is possible to use other processes and/or materials such as by forming guidance devices out of resins, fiber reinforced materials, fiberglass, ceramic, metals and the like using other fabrication processes such as other types of molding, machining, and the like. It is possible to implement embodiment of the present invention without providing for slots or recesses in the card such as by providing guidance devices which engage with straight-edged portions of a circuit board and/or providing for circuit boards which have protrusions (rather than recesses) which interdigitate or engage with guidance devices. Although it is preferred to provide a guidance device which is symmetric about two or more planes, features of the present invention can be implemented using non-symmetric guidance devices such as guidance devices having a single vertical and/or single horizontal guide and/or chamfer surface. The camming and similar functions of chamfered surfaces can also be provided by surfaces which are curved rather than being angled. It is possible to provide boards which have edges or surfaces which are chamfered for engagement with guidance devices. Although embodiments of the invention have been described in which the guidance devices are separately formed and mounted, it is possible to implement some features of the invention by fabricating guidance devices which are formed integrally with, or as part of pin blocks, chassis surfaces, side edge or other guidance device and the like. Two or more guidance devices can be provided for a circuit board, if desired. The present invention could be used if pins were positioned on the chassis and pin sockets on the board.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and\or reducing cost of implementation.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus for providing component alignment during circuit board installation comprising:
    a chassis;
    a circuit board having first and second major surfaces and at least a first edge, and second and third edges adjacent to said first edge, with a first cutout region formed in said first edge and a plurality of pins extending outward from said first edge, said cutout region defining at least a first cutout leading edge;
    a pin block having a plurality of pin-receiving sockets positioned to receive said plurality of pins when said circuit board is located in a first aligned position, wherein, when said circuit board is in said first aligned position, said first and second major surfaces are substantially horizontal;
    a guidance device including a first web defining a web leading edge spaced a first distance from said pin block, at least a portion of said first web sized and shaped to be received within said circuit board cutout region, said first web defining a web plane;
    wherein said guidance device is positioned such that said first web is located within said first cutout region of said circuit board when said circuit board is in said first aligned location wherein at least a first surface of said web adjacent said web leading edge is chamfered to provide a width of said leading edge of said web which is less than the maximum width of said web, wherein bearing of at least said first leading edge of said cutout region against said chamfered surface of said web when said circuit board is moved substantially horizontally towards said first aligned position imparts a force at a location spaced from said second and third edges, tending to align said circuit board such that said plurality of pins are aligned with said pin-receiving sockets.

2. Apparatus as claimed in claim 1, wherein said guidance device includes a shelf surface for engaging a portion of a major surface of said circuit board.

3. Apparatus as claimed in claim 2, wherein said shelf surface includes at least a first planar region substantially perpendicular to said web plane.

4. Apparatus as claimed in claim 2, wherein said shelf surface includes a region adjacent to said leading edge which is chamfered.

5. Apparatus as claimed in claim 4, where said cutout region is positioned a first distance from the closest of a first side-edge of said circuit board and a second side-edge of said circuit board.

6. Apparatus as claimed in claim 1, further comprising:
    a second circuit board, different from said first circuit board, having a cutout region on a pin-bearing edge of said second circuit board said cutout region of second circuit board positioned a second distance from the closest of a first and a second side-edge of said second circuit board, said second distance being different from said first distance;
    a second guidance device positioned to engage said cutout region of said second circuit board when said second circuit board is positioned with pins of said pin-bearing edges aligned with pin sockets on said chassis; and
    wherein said first guidance device is positioned to prevent full insertion of pins of said second circuit board in pin sockets adjacent said first aligned location.

7. Apparatus for providing component alignment during circuit board installation comprising:
   a chassis;
   a circuit board having first and second major surfaces and at least a first edge, and second and third edges adjacent to said first edge, with a first guide receiving means formed in said first edge and a plurality of pins extending outward from said first edge, said guide receiving means defining a guide receiving means leading edge;
   pin-receiving means positioned to receive said plurality of pins when said circuit board is located in a first aligned position, wherein, when said circuit board is in said first aligned position, and first and second major surfaces are substantially horizontal;
   means for guiding, including a horizontal guide means, defining a first leading edge spaced a first distance from said pin receiving means, at least a portion of said horizontal guide means sized and shaped to be received within said guide receiving means, said horizontal guide means defining a first plane;
   wherein said means for guiding is positioned such that said horizontal guide means is located within said first guide receiving means of said circuit board when said circuit board is in said first aligned location wherein at least a first surface of said horizontal guide means adjacent said first leading edge is chamfered to provide a width of said first leading edge of said horizontal guide means which is less than the maximum width of said horizontal guide means, wherein bearing of said guide receiving means leading edge against said chamfered first surface of said horizontal guide means when said circuit board is moved substantially horizontally towards said first aligned position imparts a force at a location spaced from said second and third edges, tending to align said circuit board such that said plurality of pins are aligned with said pin-receiving means.

8. Apparatus as claimed in claim 7, wherein said guidance device includes vertical guide means for engaging a portion of a major surface of said circuit board.

9. Apparatus as claimed in claim 8, wherein said vertical guide means includes at least a first planar region substantially perpendicular to said first plane.

10. Apparatus as claimed in claim 9, wherein said vertical guide means includes a region adjacent to said first leading edge which is chamfered.

11. Apparatus as claimed in claim 7, wherein said guide receiving means is positioned a first distance from the closest of a first side-edge of said circuit board and a second side-edge of said circuit board.

12. Apparatus as claimed in claim 11, further comprising:
   a second circuit board, different from said first circuit board, having a guide receiving means on a pin-bearing edge of said second circuit board said guide receiving means of second circuit board positioned a second distance from the closest of a first and a second side-edge of said second circuit board, said second distance being different from said first distance;
   a second guide means positioned to engage said guide receiving means of said second circuit board when said second circuit board is positioned with pins of said pin-bearing edges aligned with pin receiving means on said chassis; and
   wherein said first guide means is positioned to prevent full insertion of pins of said second circuit board in pin receiving means adjacent said first aligned location.

13. A method for aligning components during circuit board installation in a chassis comprising:
   providing a circuit board having first and second major surfaces and at least a first edge, and second and third edges adjacent to said first edge, with a first cutout region formed in said first edge and a plurality of pins extending outward from said first edge said cutout region defining at least a first cutout leading edge;
   providing a pin block having a plurality of pin-receiving sockets positioned on said chassis to receive said plurality of pins when said circuit board is located in a first aligned position, wherein, when said circuit board is in first aligned position, said first and second major surfaces are substantially horizontal;
   positioning a guidance device on said chassis, said guidance device including a first web defining a web leading edge spaced a first distance from said pin block, at least a portion of said first web sized and shaped to be received within said circuit board cutout region, said first web defining a web plane;
   wherein said step of positioning said guidance device includes positioning said guidance device such that said first web is located within said first cutout region of said circuit board when said circuit board is in said first aligned location wherein at least a first surface of said web adjacent said web leading edge is chamfered to provide a width of said leading edge of said web which is less than the maximum width of said web wherein bearing of at least said first leading edge of said cutout region against said chamfered surface of said web when said circuit board is moved substantially horizontally towards said first aligned position imparts a force at a location spaced from said second and third edges, tending to align said circuit board such that said plurality of pins are aligned with said pin-receiving sockets; and
   inserting said circuit board to engage said web.

14. A method as claimed in claim 13, wherein said step of inserting comprises engaging said web with at least a said first chamfered surface of said web.

15. A method as claimed in claim 13, wherein said guidance device includes a shelf surface and wherein said step of inserting comprises engaging a portion of a major surface of said circuit board with said shelf.

16. A method as claimed in claim 15, wherein said shelf surface includes at least a first planar region substantially perpendicular to said web plane.

17. A method as claimed in claim 15, wherein said step of inserting comprises engaging said portion of a major surface of said circuit board with at least a first chamfered surface of said shelf.

18. A method as claimed in claim 13, where said cutout region is positioned a first distance from the closest of a first and a second side-edge of said circuit board.

19. A method as claimed in claim 18, further comprising:
   providing a second circuit board, different from said first circuit board, having a cutout region on a pin-bearing edge of said second circuit board said cutout region of second circuit board positioned a second distance from the closest of a first and a second side-edge of said second circuit board, said second distance being different from said first distance;
   positioning a second guidance device in said chassis to engage said cutout region of said second circuit board when said second circuit board is positioned with pins of said pin-bearing edges aligned with pin sockets on said chassis; and
   wherein said first guidance device is positioned to prevent full insertion of pins of said second circuit board in pin sockets adjacent said first aligned location.

* * * * *